(12) United States Patent
Mullin et al.

(10) Patent No.: US 7,576,996 B2
(45) Date of Patent: Aug. 18, 2009

(54) TELECOMMUNICATIONS COMPONENTS HAVING REDUCED ALIEN CROSSTALK

(75) Inventors: Daniel J. Mullin, Plantsville, CT (US); Brian Celella, Southington, CT (US); Vito Pagliarulo, Bristol, CT (US); Mark Navarra, Oakville, CT (US); Olindo Savi, Kensington, CT (US); Vinicio Crudele, Watertown, CT (US); Douglas Bond, Thomaston, CT (US)

(73) Assignee: The Siemon Company, Watertown, CT (US)

( * ) Notice: Subject to any disclaimer, the term of this patent is extended or adjusted under 35 U.S.C. 154(b) by 337 days.

(21) Appl. No.: 11/546,470

(22) Filed: Oct. 11, 2006

(65) Prior Publication Data

US 2007/0082519 A1    Apr. 12, 2007

Related U.S. Application Data

(60) Provisional application No. 60/725,554, filed on Oct. 11, 2005.

(51) Int. Cl.
*H05K 7/00* (2006.01)

(52) U.S. Cl. ........................................ 361/760; 174/261

(58) Field of Classification Search .................. 361/760; 174/261; 439/101, 540, 676, 941
See application file for complete search history.

(56) References Cited

U.S. PATENT DOCUMENTS

| 6,196,880 | B1 * | 3/2001 | Goodrich et al. | ............. 439/676 |
| 6,350,158 | B1 * | 2/2002 | Arnett et al. | ................ 439/676 |
| 7,179,115 | B2 * | 2/2007 | Hashim | ...................... 439/404 |
| 7,265,300 | B2 * | 9/2007 | Adriaenssens et al. | ...... 174/258 |

* cited by examiner

*Primary Examiner*—Dean A. Reichard
*Assistant Examiner*—Yuriy Semenenko
(74) *Attorney, Agent, or Firm*—Cantor Colburn LLP

(57) ABSTRACT

A telecommunications system comprising: a first printed circuit board associated with a first port, the first printed circuit board having first plated through holes for receiving first insulation displacement contacts associated with a first connecting block and first traces on the first printed circuit board; a second printed circuit board associated with a second port, the second printed circuit board having second plated through holes for receiving second insulation displacement contacts associated with a second connecting block and second traces on the second printed circuit board; wherein one of the first plated through holes, second plated through holes, first traces and second traces is positioned to reduce alien crosstalk between the first port and the second port.

6 Claims, 4 Drawing Sheets

TELECOMMUNICATIONS COMPONENTS HAVING REDUCED ALIEN CROSSTALK

CROSS-REFERENCE TO RELATED APPLICATIONS

This application claims the benefit of U.S. provisional patent application Ser. No. 60/725,554, filed Oct. 11, 2005, the entire contents of which are incorporated herein by reference.

BACKGROUND

The invention relates generally to telecommunications components, and in particular to telecommunications components designed to reduce alien crosstalk. In an electrical communication system, it is sometimes advantageous to transmit information signals (video, audio, data) over a pair of wires (hereinafter "wire-pair" or "differential pair") rather than a single wire, wherein the transmitted signal comprises the voltage difference between the wires without regard to the absolute voltages present. Each wire in a wire-pair is susceptible to picking up electrical noise from sources such as lightning, automobile spark plugs and radio stations to name but a few. Because this type of noise is common to both wires within a pair, the differential signal is typically not disturbed. This is a fundamental reason for having closely spaced differential pairs.

Alien crosstalk is the differential crosstalk that occurs between communication channels. To reduce this form of alien crosstalk, shielded systems containing shielded twisted pairs or foiled twisted pair configurations may be used. However, the inclusion of shields can increase cost of the system. Another approach to reduce or minimize alien crosstalk utilizes spatial separation of cables within a channel and/or spatial separation between the jacks in a channel. However, this is typically impractical because bundling of cables and patch cords is common practice due to "real estate" constraints and ease of wire management.

Thus, there is a need in the art for telecommunications components that reduce or minimize alien crosstalk between communications channels.

SUMMARY

An embodiment of the invention is a telecommunications system comprising: a first printed circuit board associated with a first port, the first printed circuit board having first plated through holes for receiving first insulation displacement contacts associated with a first connecting block and first traces on the first printed circuit board; a second printed circuit board associated with a second port, the second printed circuit board having second plated through holes for receiving second insulation displacement contacts associated with a second connecting block and second traces on the second printed circuit board; wherein one of the first plated through holes, second plated through holes, first traces and second traces is positioned to reduce alien crosstalk between the first port and the second port.

DETAILED DESCRIPTION

Embodiments of the invention provide category 6 augmented compliant components for the new IEEE 802.3an 10GBASE-T application which is furthered defined in the draft TIA/EIA-568-B.2-10 Augmented category 6 draft. Connectors, cables, and patch cords meet the new alien near end crosstalk (ANEXT) and alien far end crosstalk (AFEXT) requirements. The alien crosstalk requirements are defined by limits in the TIA/EIA-568-B.2-10 draft and are called powersum alien NEXT and powersum alien equal level far end crosstalk (ELFEXT). These limits were defined to minimize noise from one connector or channel to another.

Market trends have shown a need for faster networks with greater bandwidth. The Institute of Electrical and Electronics Engineers (IEEE) has established a project team (formally known as IEEE 802.3an™) to develop 10 Gigabit Ethernet that would operate over horizontal, structured twisted pair cabling.

The IEEE project team has identified alien crosstalk to be the most dominant noise source in the proposed channel. A channel is comprised of cable, connectors and patch cords. The "channel" is designed to meet minimum performance criteria to ensure its ability to transmit the given application such as 10 Gigabit Ethernet. The Telecommunications Industry Association (TIA) is given the task of defining the cable, cord and connector requirements in support of the "channel" requirements needed to guarantee 10 Gigabit Ethernet transmissions.

Figure 1A:
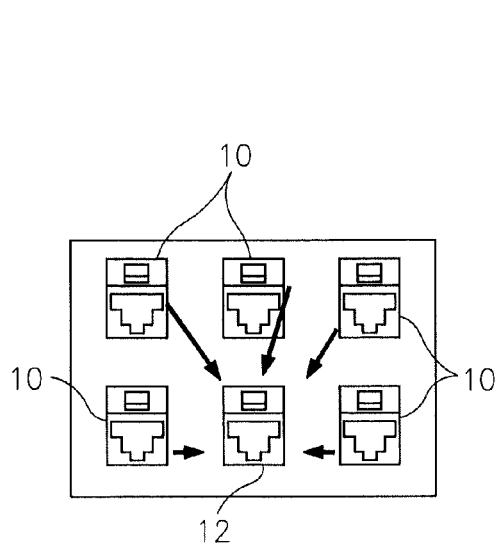
FIG. 1A illustrates alien crosstalk between outlets.
Figure 1B:
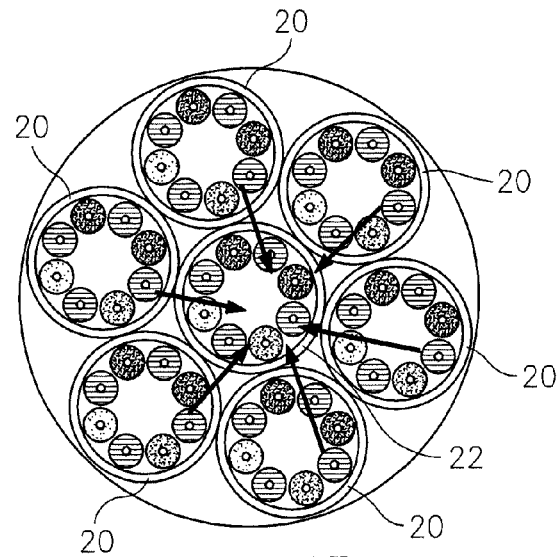
FIG. 1B illustrates alien crosstalk between cables.

Alien crosstalk is a measure of unwanted signal coupling from one or more pairs from one channel (or more) to a neighboring adjacent channel, expressed in decibels. FIGS. 1A and 1B show conceptual drawings of alien crosstalk in a cluster of connectors and cables. In FIG. 1A, outlets 10 are depicted contributing alien crosstalk to outlet 12. The outlets 10 and 12 are connected to cables and patch cords in a channel and are subject to alien crosstalk from the neighboring connectors as shown. In FIG. 1B, cables 20 are depicted contributing alien crosstalk to cable 22.

Alien crosstalk is a very difficult parameter to model due to its random statistical nature. The affects of alien crosstalk are best described using the powersum mathematical relationship. The requirements specified by TIA and IEEE are in the form of Powersum alien NEXT and Powersum alien ELFEXT as shown below:

PS ANEXT$_k$ of pair k is computed as follows:

$$PS\ ANEXT_k = -10 lg \sum_{i=1, i \neq k}^{n} 10^{\frac{-ANEXT_{ik}}{10}} \quad (6)$$

where
i is the number of the disturbing pair;
k is the number of the disturbed pair;

n is the total number of disturbing pairs;

$ANEXT_{ik}$ is the alien near end crosstalk loss coupled from pair i into pair k.

In exemplary embodiments, within each connector and through the channel there are 4 pairs of wires. Powersum adds the noise from the different combinations for each pair, 1 through 4. For example, each connector has four pairs, P1, P2, P3 and P4. The noise from each connector to the victim connector for each pair combination is summed (P1/1, P2/1, P3/1, P4/1) for each connector that surrounds the victim. The TIA test method calls for 6 connectors to surround the victim cable. The affects of all pair 1 combinations are then summed together. The worse case alien crosstalk coupling occurs with pairs exhibiting similar twist rates. The response of the multiple disturbers to one (of 4 possible) victim pair is summed to obtain the mathematical powersum coupling.

The like pair responses tend to add and can cause spikes in the data due to the powersum formula. To minimize the spikes of like pair combinations, it is advantageous to limit the likeness of cables and connectors in the surrounding area. This can be done in several ways as described herein.

Figure 2:
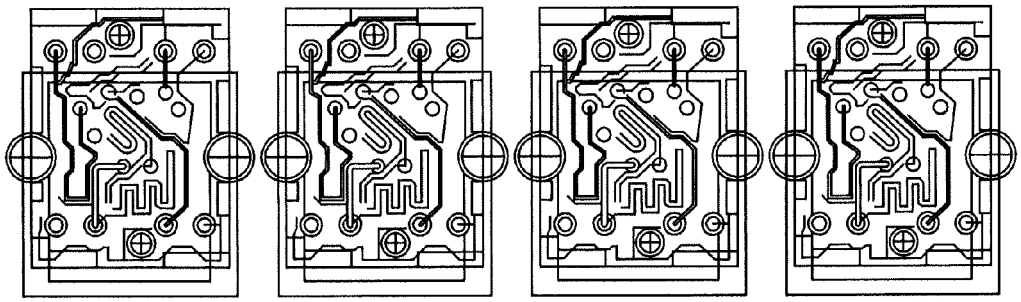
FIG. 2 illustrates printed circuit boards as positioned in a patch panel.

FIG. 2 shows a series of conventional PCBs corresponding to adjacent ports in a patch panel, for example. The PCBs may be similar to those described in U.S. published patent application 20040147165, the entire contents of which are incorporated herein by reference. The PCBs in FIG. 2 have the same trace layout.

Figure 3:
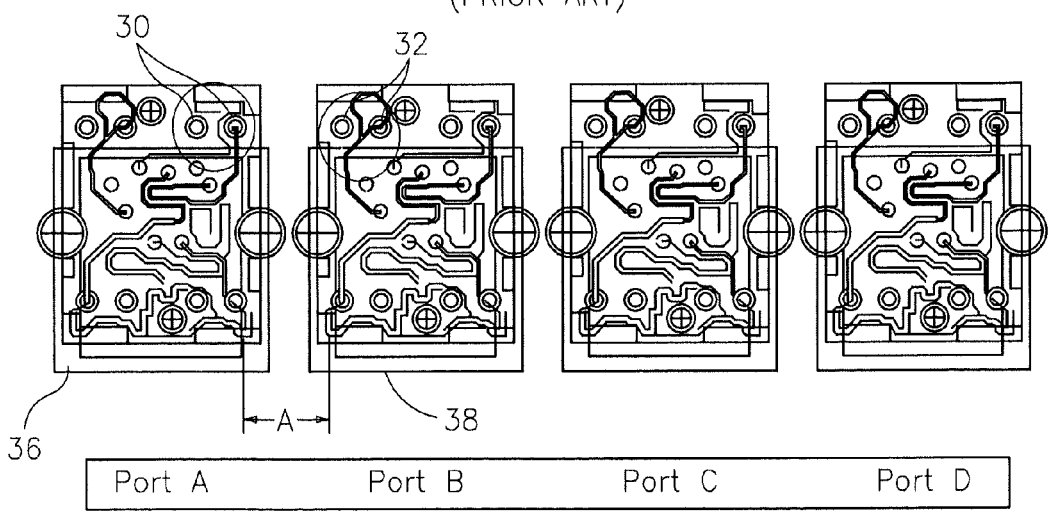
FIG. 3 illustrates alien crosstalk between printed circuit boards of FIG. 2.

FIG. 3 illustrates a distance A between connecting block insulation displacement contacts (IDCs) of conventional PCBs. As known in the art, (IDCs) are electrically connected to the PCB at plated through holes 30 and 32. The IDCs are preferably part of a connecting block, which provides a point at which wires are terminated to the component. As discussed herein, the IDCs in plated through holes 30 and 32 provide a location for alien crosstalk as the IDCs radiate signals between PCBs 36 and 38. One of the major contributors to alien crosstalk coupling between connectors comes from the termination of the cable to the connecting block. The close proximity and the size (height and width) of the IDCs tend to radiate a lot of coupling signals.

Figure 4:
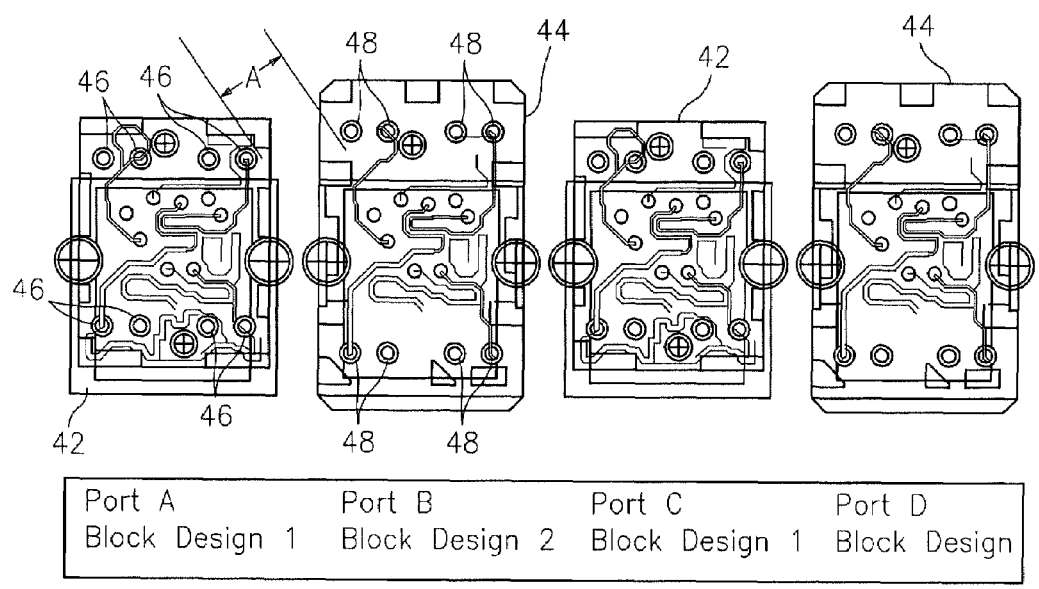
FIG. 4 illustrates a first embodiment for reducing alien crosstalk printed circuit boards.

Embodiments of the invention increase the distance between IDCs in connecting blocks by offsetting the connector ports completely (meaning the jack, PCB, and block are shifted) or by offsetting the connecting block only. FIG. 4 shows a first embodiment in which PCBs 42 and 44 use a two different connecting blocks resulting in different footprints for plated through holes 46 and 48. Plated through holes 46 and 48 receive IDCs in the connecting blocks. The PCB used may alternate (e.g., 42, 44, 42, 44) across the ports in a patch panel. The jack connections remain in the same location from port to port. As shown in FIG. 4, this results in increased distance A between connecting block IDCs 46 and 48, thus reducing alien crosstalk.

Figure 5:
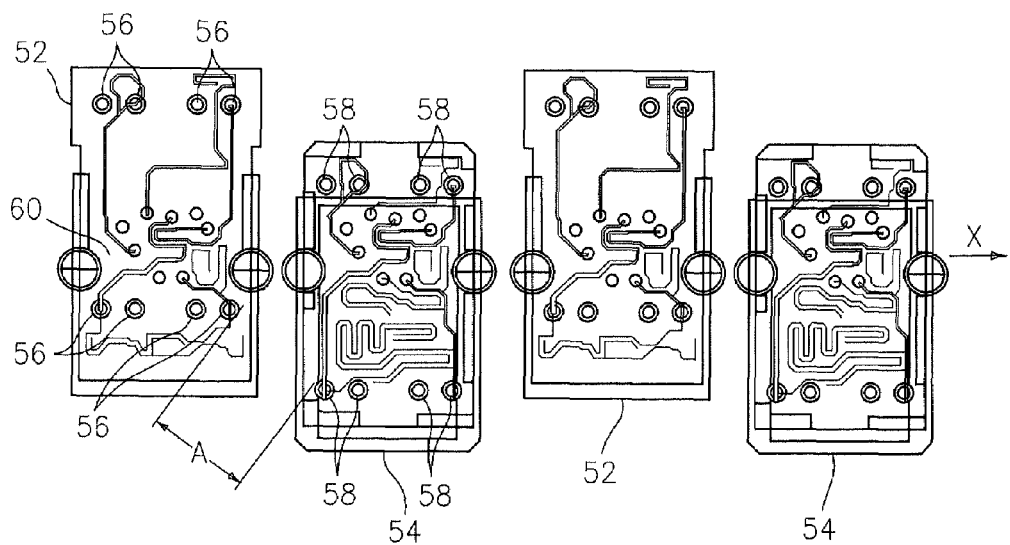
FIG. 5 illustrates a second embodiment for reducing alien crosstalk printed circuit boards.

FIG. 5 shows four adjacent port PCBs 52 and 54 using the same connecting block design having the same footprint of plated through holes 56 and 58. In this embodiment, the connecting block is shifted in a first direction on port 52 and a second direction (opposite the first direction) on port 54. The shifting of the plated through holes for the connecting block is relative to the jack through holes 60 on the PCBs 52 and 54. The jack through holes footprint 60 remains in the same location from port to port aligned on axis X. The plated through holes 56 and 58 are shifted relative to each other in a direction perpendicular to axis X to achieve separation. The PCB used may alternate (e.g., 52, 54, 52, 54) across the ports in a patch panel.

By utilizing a different connecting block on the connector (as shown in FIG. 4) or shifting the location of a common connecting block (as FIG. 5), the distance, A, between the connecting block IDCs of one port to the next is increased.

In many PCB embodiments, PCB traces are used to reduce crosstalk for a given category or transmission performance. Exemplary PCB designs are described in U.S. published patent application 20040147165. In conventional designs, each adjacent port in a patch panel uses a PCB having the same trace layout.

Figure 6:
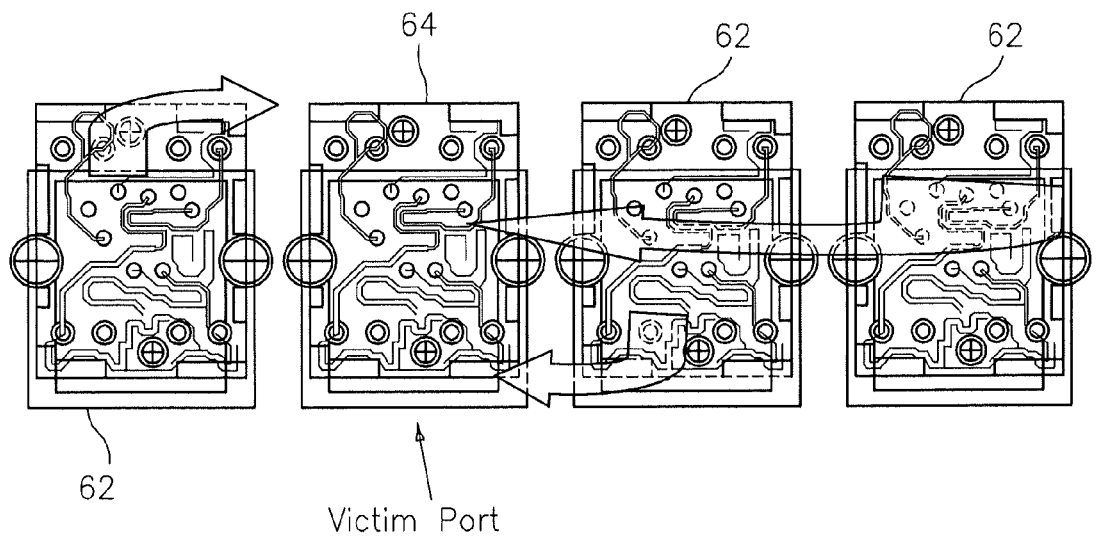
FIG. 6 illustrates alien crosstalk between printed circuit boards.

FIG. 6 illustrates the alien crosstalk coupling from adjacent PCBs 62 to the "victim" PCB 64. The connectors in FIG. 6 are identical as represented by their PCB trace layouts.

The amount of alien crosstalk is also dependent on the distance between connectors. As the distance increases the magnitude of the coupling fields decrease and the level of Powersum ANEXT and Powersum alien ELFEXT also decreases. However, in instances when space is not available, improvements can also be obtained from eliminating similar features from adjacent ports.

Figure 7:
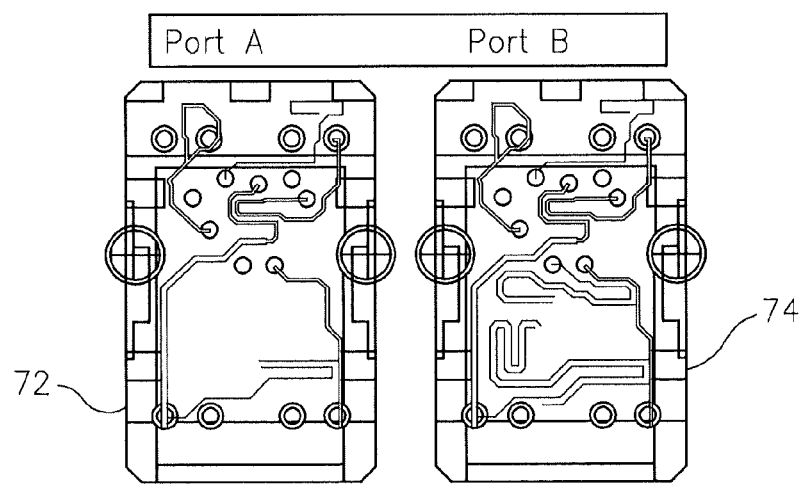
FIG. 7 illustrates a third embodiment for reducing alien crosstalk printed circuit boards.

FIG. 7 illustrates embodiments of the invention in which adjacent connectors have the same jack and connecting block (not shown), but different trace patterns on the PCB. PCB 72 has a trace pattern that differs from that on PCB 74. Improvements in alien crosstalk are obtained by eliminating or repositioning like/similar compensation traces or current carrying traces, in one port design versus the next. Port A has one PCB trace design 72 and port B has another PCB trace design 74. The two trace patterns can be alternated in a multi-port panel or faceplate (ABABABAB . . . B). The differing trace patterns on the PCBS 72 and 74 reduces alien crosstalk between the two PCBs.

Figure 8:
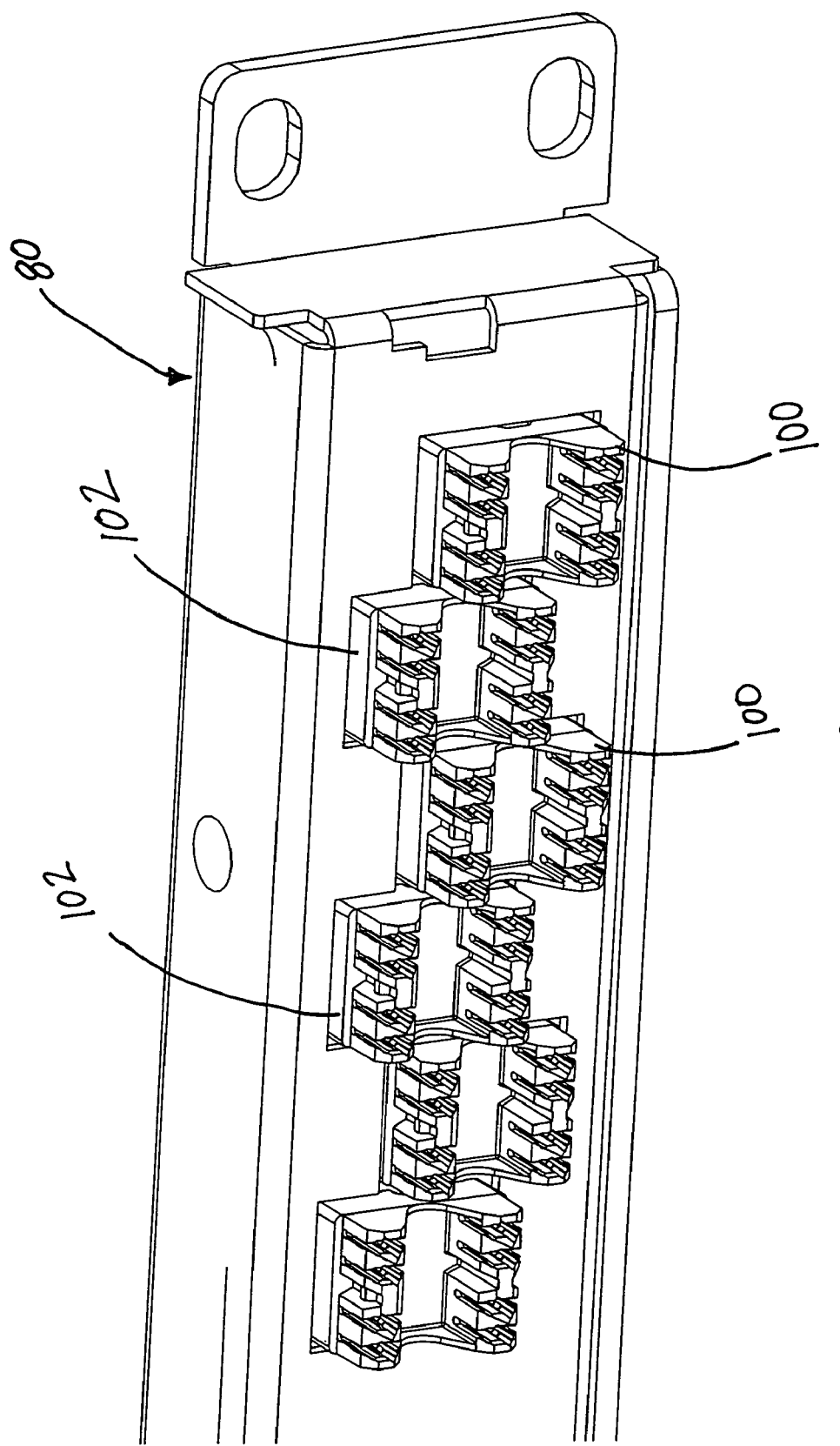
FIG. 8 is a perspective view of the rear of a patch panel.

FIG. 8 is a perspective view of the rear of a patch panel 80 that utilizes PCBs 52 and 54 of FIG. 5. As shown in FIG. 8, the connecting blocks 100 and 102 are staggered relative to each other. This is due to the different circuit boards 52 and 54, and the locations of the plated through holes 56 and 58 on the respective boards. Connecting blocks 100 and 102 are the same, but shifted due to the configuration of circuit boards 52 and 54.

Embodiments of the invention use varying PCB layouts to reduce alien crosstalk. Exemplary designs utilize two different printed connector designs in adjacent ports of a patch panel (or faceplate) to eliminate similarities in adjacent designs that would couple as noise from one connector (channel) to the adjacent connector (channel). These designs cover a minimum of two ports but can also be utilized in any number of ports. A connector includes a jack, printed circuit board (PCB), and connecting block as known in the art. A connector design can also be of the lead-frame type. Connectors can be individually arranged in patch panels or be part of a PCB type multi-connector design where one PCB board has several connector ports. To reduce alien crosstalk, adjacent ports have different electrical layouts. This difference can be accomplished by having a different printed circuit board trace layout in the adjacent ports or completely different components, such as the jack, connecting block, and PCB.

Embodiments of the invention use different connectors in adjacent ports. In a side-by-side scenario or patch panel implementation, each connector location is designated as a "port". A two-port implementation would then have two completely different connectors such as a PCB type connector next to a lead frame type connector or two different types of PCB style connectors. This could also be done in a patch panel that uses individual connectors. Each port would alternate connectors. For example, ports 1,3, 5 . . x would be the same PCB type connector and ports 2,4,6 . . y would be the lead frame type.

Patch panels can have multiple ports, such as 24, or they can be individually inserted connectors or a finished patch panel with connector components (connecting block and jack) mated a single PCB with multiple jacks/blocks. In most multi-port (2 or more) printed circuit board designs, the jack and block at each port are the same and the PCB compensated trace layout is the same as shown in FIG. 3.

While this invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention.

What is claimed is:

1. A telecommunications system comprising:
    a first printed circuit board associated with a first port, the first printed circuit board having first plated through holes for receiving first insulation displacement contacts associated with a first connecting block and first traces on the first printed circuit board;
    a second printed circuit board associated with a second port, the second printed circuit board having second plated through holes for receiving second insulation displacement contacts associated with a second connecting block and second traces on the second printed circuit board;
    wherein one of the first plated through holes, second plated through holes, first traces and second traces is positioned to reduce alien crosstalk between the first port and the second port;
    wherein the first plated through holes are positioned in a first footprint on the first printed circuit board corresponding to the first connecting block and the second plated through holes are positioned in a second footprint on the second printed circuit board corresponding to the second connecting block, the first footprint being different than the second footprint to define an increased distance between the first plated through holes and the second plated through holes.

2. The telecommunications system of claim 1 further comprising:
    a third printed circuit board associated with a third port, the third printed circuit board having third plated through holes positioned in the first footprint for receiving third insulation displacement contacts associated with a third connecting block;
    a fourth printed circuit board associated with a fourth port, the fourth printed circuit board having fourth plated through holes positioned in the second footprint for receiving fourth insulation displacement contacts associated with a fourth connecting block;
    the first port, second port, third port and fourth port being arranged in sequential order in the telecommunications system.

3. A telecommunications system comprising:
    a first printed circuit board associated with a first port, the first printed circuit board having first plated through holes for receiving first insulation displacement contacts associated with a first connecting block and first traces on the first printed circuit board;
    a second printed circuit board associated with a second port, the second printed circuit board having second plated through holes for receiving second insulation displacement contacts associated with a second connecting block and second traces on the second printed circuit board:
    wherein one of the first plated through holes, second plated through holes, first traces and second traces is positioned to reduce alien crosstalk between the first poi and the second port;
    the first printed circuit board includes first jack through holes and the second portioned circuit board includes second jack through holes, the first jack through holes being aligned with the second jack through holes along an axis;
    the first plated through holes and the second plated through holes are positioned in a common footprint, the first plated through holes being shifted relative to the second plated through holes perpendicular to the axis to define an increased distance between the first plated through holes and the second plated through holes.

4. The telecommunications system of claim 3 further comprising:
    a third printed circuit board associated with a third port, the third printed circuit board having third plated through holes positioned in the common footprint for receiving third insulation displacement contacts associated with a third connecting block;
    a fourth printed circuit board associated with a fourth port, the fourth printed circuit board having fourth plated through holes positioned in the common footprint for receiving fourth insulation displacement contacts associated with a fourth connecting block;
    the third plated through holes being shifted relative to the fourth plated through holes perpendicular to the axis to define an increased distance between the third plated through holes and the fourth plated through holes;
    the first port, second port, third port and fourth port being arranged in sequential order in the telecommunications system.

5. A telecommunications system comprising:
    a first printed circuit board associated with a first port, the first printed circuit board having first plated through holes for receiving first insulation displacement contacts associated with a first connecting block and first traces on the first printed circuit board;
    a second printed circuit board associated with a second port, the second printed circuit board having second plated through holes for receiving second insulation displacement contacts associated with a second connecting block and second traces on the second printed circuit board;
    wherein one of the first plated through holes, second plated through holes, first traces and second traces is positioned to reduce alien crosstalk between the first port and the second port;
    the first traces being positioned in a first pattern and the second traces being positioned in a second pattern, the first pattern being different from the second pattern to reduce alien crosstalk between the first port and the second port.

6. The telecommunications system of claim 5 further comprising:
a third printed circuit board associated with a third port, the third printed circuit having third traces positioned in the first pattern;
a fourth printed circuit board associated with a fourth port, the fourth printed circuit having fourth traces positioned in the second pattern;
the first port, second port, third port and fourth port being arranged in sequential order in the telecommunications system.

* * * * *